(12) United States Patent
Yunker

(10) Patent No.: US 7,159,203 B2
(45) Date of Patent: Jan. 2, 2007

(54) DIFFERENTIAL DELAY-LINE

(75) Inventor: Lisa Ann Yunker, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 418 days.

(21) Appl. No.: 10/897,745

(22) Filed: Jul. 22, 2004

(65) Prior Publication Data

US 2006/0031806 A1 Feb. 9, 2006

(51) Int. Cl.
*G06F 17/50* (2006.01)
*G01R 31/28* (2006.01)
*H01L 25/00* (2006.01)

(52) U.S. Cl. .............. 716/15; 716/5; 716/6; 324/158.1; 327/565

(58) Field of Classification Search ............ 716/1, 716/5, 6, 10, 15; 257/531, 669, 690, 736; 324/158.1; 327/565
See application file for complete search history.

(56) References Cited

U.S. PATENT DOCUMENTS

| | | | | |
|---|---|---|---|---|
| 4,920,882 A | * | 5/1990 | Hoyt | 400/708 |
| 5,308,928 A | * | 5/1994 | Parla et al. | 174/261 |
| 5,453,713 A | * | 9/1995 | Partovi et al. | 327/565 |
| 5,994,766 A | * | 11/1999 | Shenoy et al. | 257/659 |
| 6,614,221 B1 | * | 9/2003 | Cushing et al. | 324/158.1 |
| 6,661,690 B1 | * | 12/2003 | Moriarty et al. | 365/63 |
| 6,788,135 B1 | * | 9/2004 | Yunker et al. | 327/565 |
| 6,886,147 B1 | * | 4/2005 | Johnson et al. | 716/6 |
| 6,927,992 B1 | * | 8/2005 | Yen | 365/63 |
| 7,051,309 B1 | * | 5/2006 | Crosetto | 716/10 |
| 7,117,464 B1 | * | 10/2006 | Frank et al. | 716/5 |
| 2003/0090879 A1 | * | 5/2003 | Doblar et al. | 361/728 |
| 2003/0168737 A1 | * | 9/2003 | Figueroa et al. | 257/736 |
| 2005/0248022 A1 | * | 11/2005 | Badr et al. | 257/690 |
| 2006/0151851 A1 | * | 7/2006 | Pillai et al. | 257/531 |

* cited by examiner

*Primary Examiner*—Jack Chiang
*Assistant Examiner*—Helen Rossoshek
(74) *Attorney, Agent, or Firm*—Leslie P. Gehman

(57) ABSTRACT

A printed circuit board is built including metal traces for a differential clock. Within a break in each metal trace pads for a delay line socket are included along with pads for two 0-ohm resistors in series. In between the two 0-ohm resistors metal traces are build in a configuration to provide a specified delay in a signal passing through the trace. This group of pads and traces allows a designer to test (on the completed printed circuit board) differential clocks in modes including negative skew. In normal operation, the 0-ohm resistors are present on the printed circuit board and the clock signals pass through the metal traces build in a configuration to provide a specified delay in the signals passing through the traces. During testing, delay lines may be placed in the delay line sockets and the 0-ohm resistors may be removed. When 0 ns delay lines are placed in the sockets, the clock delays are negatively skewed from normal delay since the clock signals no longer pass through the long metal traces between the 0-ohm resistors.

10 Claims, 5 Drawing Sheets

DIFFERENTIAL DELAY-LINE

FIELD OF THE INVENTION

The present invention relates generally to the field of electronic devices on printed circuit boards, and more particularly to the field of differential clock skew testing on printed circuit boards.

BACKGROUND OF THE INVENTION

Many present day electronic devices include very complex and expensive printed circuit boards. These electronic devices may also include high-speed differential clocks. Proper design of electronic devices includes testing the operating margins of the devices prior to release for production. One of the margin tests commonly used in design is to skew clock edges to determine how far out-of-alignment clock edges may get before failure occurs. It is quite easy to add delay to a clock trace, a socket may be designed into the printed circuit board configured to accept a variety of delay lines. By changing the delay lines in the socket, a variety of clock skews may be tested. However, there is no easy way to add negative clock skew to an existing clock trace. There is a need in the art for a method and apparatus allowing designers to test both negative and positive clock skews.

Also, since printed circuit boards may be highly complex and very expensive to design, there is a need in the art for a printed circuit board capable of producing both negative and positive clock skews in a test mode, while the same printed circuit board design may be used for production without any clock skew.

SUMMARY OF THE INVENTION

A printed circuit board is built including metal traces for a differential clock. Within a break in each metal trace pads for a delay line socket are included along with pads for two 0-ohm resistors in series. In between the two 0-ohm resistors metal traces are built in a configuration to provide a specified delay in a signal passing through the trace. This group of pads and traces allows a designer to test (on the completed printed circuit board) differential clocks in modes including negative skew. In normal operation, the 0-ohm resistors are present on the printed circuit board and the clock signals pass through the metal traces built in a configuration to provide a specified delay in the signals passing through the traces. During testing, delay lines may be placed in the delay line sockets and the 0-ohm resistors may be removed. When 0 ns delay lines are placed in the sockets, the clock delays are negatively skewed from normal delay since the clock signals no longer pass through the long metal traces between the 0-ohm resistors.

Other aspects and advantages of the present invention will become apparent from the following detailed description, taken in conjunction with the accompanying drawings, illustrating by way of example the principles of the invention.

DETAILED DESCRIPTION

Figure 1:
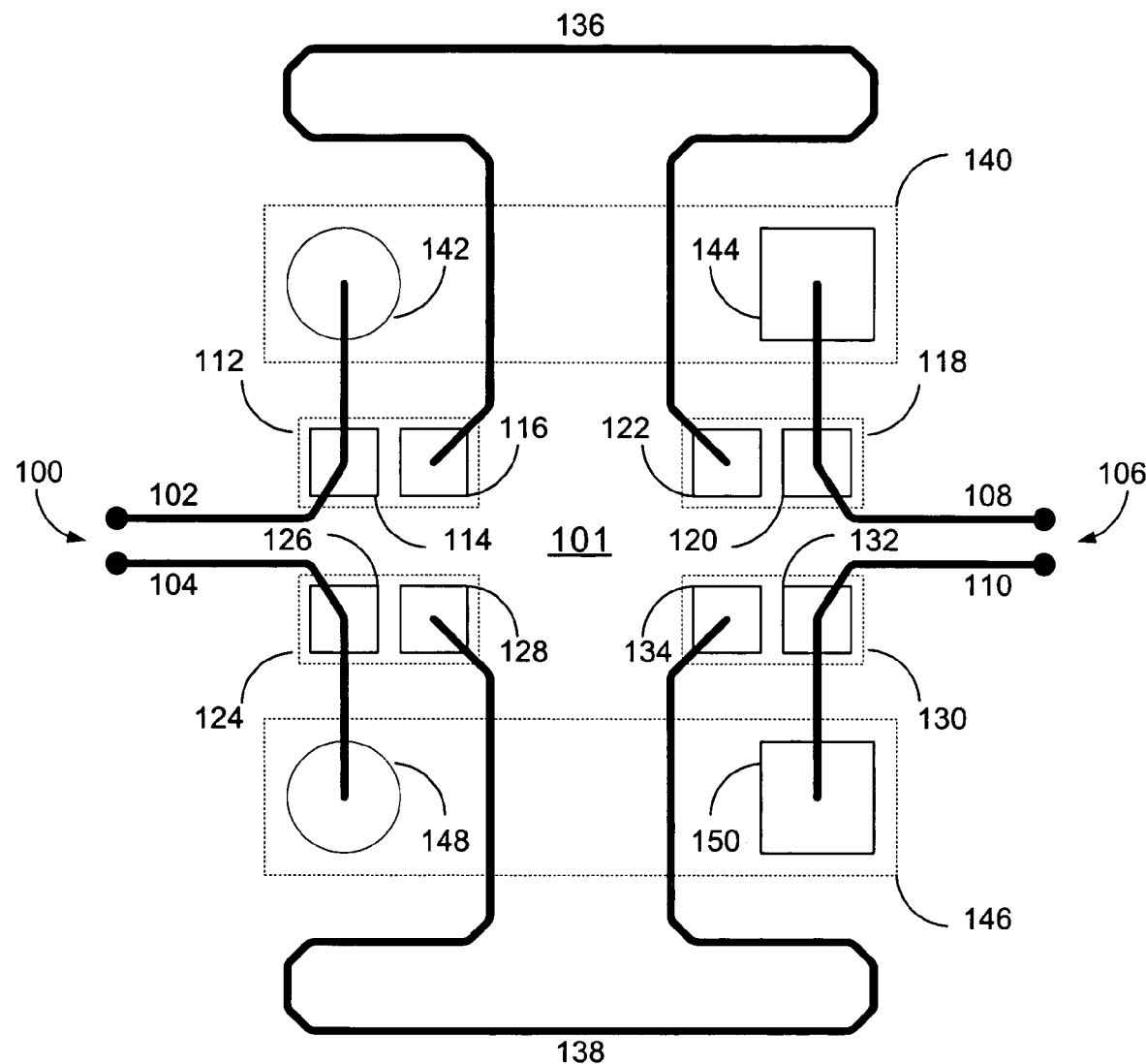
FIG. 1 is a top view of a printed circuit board including differential clock delay lines according to the present invention.

FIG. 1 is a top view of a printed circuit board including differential clock delay lines according to the present invention. This example embodiment of the present invention shows a portion of the metal traces present on a printed circuit board 101. In this simplified illustration, all metal traces and pads are shown in a single metal layer on top of the printed circuit board 101. Those of skill in the art will recognize that many embodiments of the present invention will utilize a plurality of metal layers within the printed circuit board 101 to implement these delay lines within the scope of the present invention. In this example embodiment of the present invention, a differential clock input signal 100 arrives from elsewhere on the printed circuit board 101. This differential clock input signal 100 enters two metal traces, an upper differential clock input trace 102, and a lower differential clock input trace 104. In order to prevent the creation of skew between the differential clock signals, all of the printed circuit board traces and pads are as identical as possible between the two clock signals in this example embodiment of the present invention. Those of skill in the art will recognize that other implementations of the present invention may intentionally impart a quantity of skew between the pair of clock signals, perhaps to compensate for unwanted skews from elsewhere in the system. In this example embodiment of the present invention the upper differential clock input trace 102 first connects with a first pad 114 of a first, upper 0-ohm resistor landing site 112. The upper differential clock input trace 102 then continues on to connect with a first pad 142 of an upper delay line landing site 140. When the first, upper 0-ohm resistor is present on the first, upper 0-ohm resistor landing site 112, the first pad 114, and the second pad 116 of the first, upper 0-ohm resistor landing site 112 are shorted together and thus the upper differential clock input trace 102 is shorted to the upper printed circuit delay line 136. After the upper clock signal passes through the upper printed circuit delay line 136, it reaches the first pad 122 of a second, upper 0-ohm resistor landing site 118. When the second, upper 0-ohm resistor is present on the second, upper 0-ohm resistor landing site 118, the first pad 122, and the second pad 120 of the second, upper 0-ohm resistor landing site 118 are shorted together and thus the upper printed circuit delay line 136 is coupled with the upper differential clock output trace 108. In this example embodiment of the present invention the lower differential clock input trace 104 first connects with a first pad 126 of a first, lower 0-ohm resistor landing site 124. The lower differential clock input trace 104 then continues on to connect with a first pad 148 of a lower delay line landing site 146. When the first, lower 0-ohm resistor is present on the first, lower 0-ohm resistor landing site 124, the first pad 126, and the second pad 128 of the first, lower 0-ohm resistor landing site 124 are shorted together and thus the lower differential clock input trace 104 is shorted to the lower printed circuit delay line 138. After the lower clock signal passes through the lower printed circuit delay line 138, it reaches the first pad 134 of a second, lower 0-ohm resistor landing site 130. When the second, lower 0-ohm resistor is present on the second, lower 0-ohm resistor landing site 130, the first pad 134, and the second pad 130 of the second, lower 0-ohm resistor landing site 130 are shorted together and thus the lower printed circuit delay line 138 is coupled with the lower differential clock output trace 110. The upper and lower differential clock output traces comprise a differential clock output signal 106 that connects to devices elsewhere on the printed circuit board 101. Those of skill in the art will recognize that the terms 'upper' and 'lower' as used within the present specification are used merely to distinguish between the two signals of the differential clock. The terms do not define any spatial relationship between the two signals since 'upper' and 'lower' may be defined relative to how the printed circuit board is oriented at any given time.

In the example embodiment of the present invention shown in FIG. 1, a small amount of delay is added to the differential clock signals by the upper and lower printed circuit delay lines 136 and 138. The length of these printed circuit delay lines are chosen to impart a specific delay to a signal passing through the delay lines. For example, in a typical printed circuit board trace signals travel at about 180 ps per inch, so a trace designed to implement a 200 ps delay would be about 1.11 inches long, and a trace designed to implement a 400 ps delay would be about 2.22 inches long. In a normal use of the present invention the four 0-ohm resistors would be affixed to the printed circuit board 101 at their landing sites and the differential clock signals would pass through the upper and lower printed circuit delay lines 136 and 138. For testing reasons, it is desirable to impart a variety of skews to the differential clock signals. In some cases, it is also desirable to be able to impart a negative skew to one or both of the differential clock signals. When a printed circuit board is designed according to the present invention with printed circuit delay lines of 200 ps, when the 0 ps delay lines are placed in the delay line sockets and the four 0-ohm resistors are removed (effectively bypassing the printed circuit board delay lines) a skew of −200 ps is created in the differential clocks. This ability allows designers to test the robustness of their designs over a very wide range of skew times since the upper limit of skew is limited only by the delay lines placed in the delay line sockets. The lower limit of skew is negative skew equal to the delay created by the printed circuit board delay lines. When larger negative skew is required for margin testing, longer printed circuit board delay lines are constructed in the printed circuit board. Those of skill in the art will recognize that by use of the present invention a printed circuit board may be designed for use as a test board allowing designers the opportunity to skew test the differential clocks (when the delay line sockets are used), and for production use (when the four 0-ohm resistors are used) thus eliminating the necessity of different board designs for testing and production.

Figure 2:
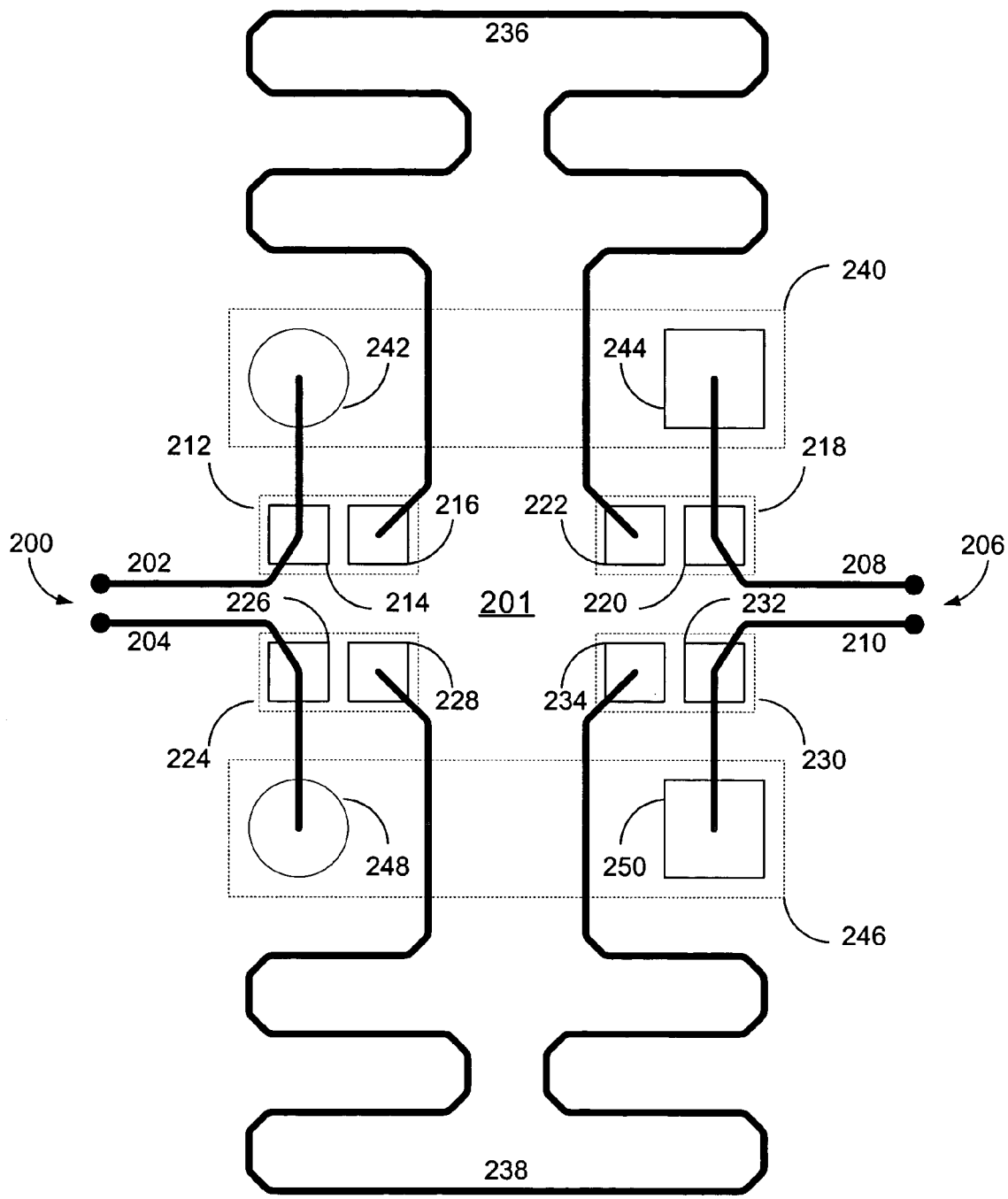
FIG. 2 is a top view of a printed circuit board including differential clock delay lines according to the present invention.

FIG. 2 is a top view of a printed circuit board including differential clock delay lines according to the present invention. This example embodiment of the present invention is identical to that of FIG. 1 with the exception of the length of the printed circuit board delay lines. In this example embodiment of the present invention, the printed circuit board delay lines are about twice the length of those shown in FIG. 1, resulting in a delay of about twice that of the circuit shown in FIG. 1. In this example embodiment of the present invention, a differential clock input signal 200 arrives from elsewhere on the printed circuit board 201. This differential clock input signal 200 enters two metal traces, an upper differential clock input trace 202, and a lower differential clock input trace 204. In order to prevent the creation of skew between the differential clock signals, all of the printed circuit board traces and pads are as identical as possible between the two clock signals in this example embodiment of the present invention. Those of skill in the art will recognize that other implementations of the present invention may intentionally impart a quantity of skew between the pair of clock signals, perhaps to compensate for unwanted skews from elsewhere in the system. In this example embodiment of the present invention the upper differential clock input trace 202 first connects with a first pad 214 of a first, upper 0-ohm resistor landing site 212. The upper differential clock input trace 202 then continues on to connect with a first pad 242 of an upper delay line landing site 240. When the first, upper 0-ohm resistor is present on the first, upper 0-ohm resistor landing site 212, the first pad 214, and the second pad 216 of the first, upper 0-ohm resistor landing site 212 are shorted together and thus the upper differential clock input trace 202 is shorted to the upper printed circuit delay line 236. After the upper clock signal passes through the upper printed circuit delay line 236, it reaches the first pad 222 of a second, upper 0-ohm resistor landing site 218. When the second, upper 0-ohm resistor is present on the second, upper 0-ohm resistor landing site 218, the first pad 222, and the second pad 220 of the second, upper 0-ohm resistor landing site 218 are shorted together and thus the upper printed circuit delay line 236 is coupled with the upper differential clock output trace 208. In this example embodiment of the present invention the lower differential clock input trace 204 first connects with a first pad 226 of a first, lower 0-ohm resistor landing site 224. The lower differential clock input trace 204 then continues on to connect with a first pad 248 of a lower delay line landing site 246. When the first, lower 0-ohm resistor is present on the first, lower 0-ohm resistor landing site 224, the first pad 226, and the second pad 228 of the first, lower 0-ohm resistor landing site 224 are shorted together and thus the lower differential clock input trace 204 is shorted to the lower printed circuit delay line 238. After the lower clock signal passes through the lower printed circuit delay line 238, it reaches the first pad 234 of a second, lower 0-ohm resistor landing site 230. When the second, lower 0-ohm resistor is present on the second, lower 0-ohm resistor landing site 230, the first pad 234, and the second pad 230 of the second, lower 0-ohm resistor landing site 230 are shorted together and thus the lower printed circuit delay line 238 is coupled with the lower differential clock output trace 210. The upper and lower differential clock output traces comprise a differential clock output signal 206 that connects to devices elsewhere on the printed circuit board 201.

Figure 3:
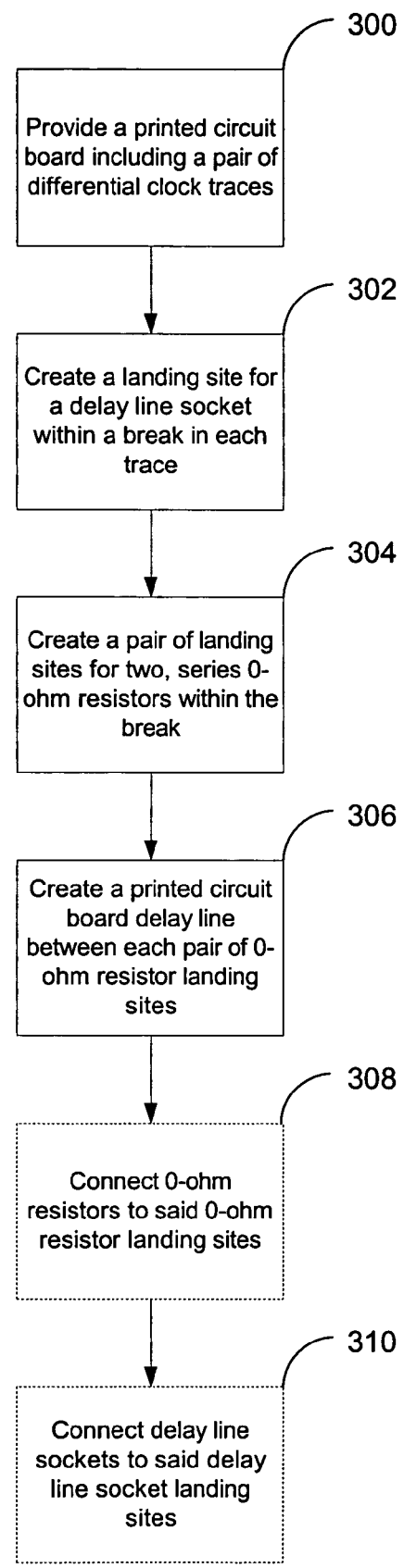
FIG. 3 is a flow chart of a method of producing differential clock delay lines on a printed circuit board according to the present invention.

FIG. 3 is a flow chart of a method of producing differential clock delay lines on a printed circuit board according to the present invention. In a step 300, a printed circuit board including a pair of differential clock traces is provided. In a step 302, within a break in each of the traces, a landing site for a delay line socket is created. In a step 304, within the break in each of the traces, landing sites for two, series 0-ohm resistors are created. In a step 306, a printed circuit board delay line is created between each pair of 0-ohm resistor landing sites. In an optional step 308, 0-ohm resistors are connected to the 0-ohm resistor landing sites. In an optional step 310, delay line sockets are connected to the delay line socket landing sites and delay lines are connected to the delay line sockets.

Figure 4:
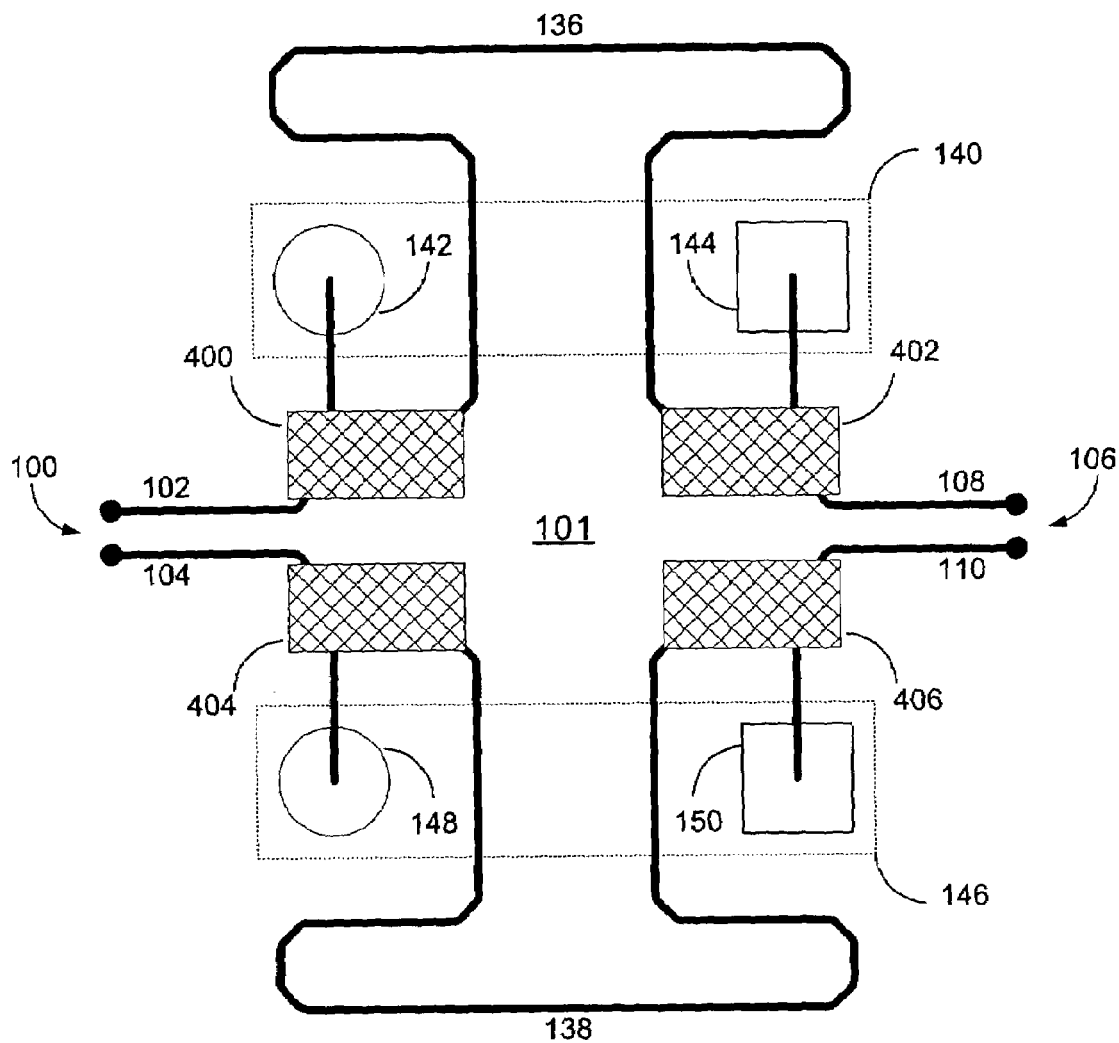
FIG. 4 is a top view of the printed circuit board from FIG. 1 in a production mode with the 0-ohm resistors installed.

FIG. 4 is a top view of the printed circuit board from FIG. 1 in a production mode with the 0-ohm resistors installed. This example embodiment of the present invention is identical to that shown in FIG. 1, with the exception that a first, upper 0-ohm resistor 400 has been connected to the first, upper 0-ohm resistor landing site 112. A second, upper 0-ohm resistor 402 has been connected to the second, upper 0-ohm resistor landing site 118. A first, lower 0-ohm resistor 404 has been connected to the first, lower 0-ohm resistor landing site 124. A second, lower 0-ohm resistor 406 has been connected to the second, lower 0-ohm resistor landing site 130.

Figure 5:
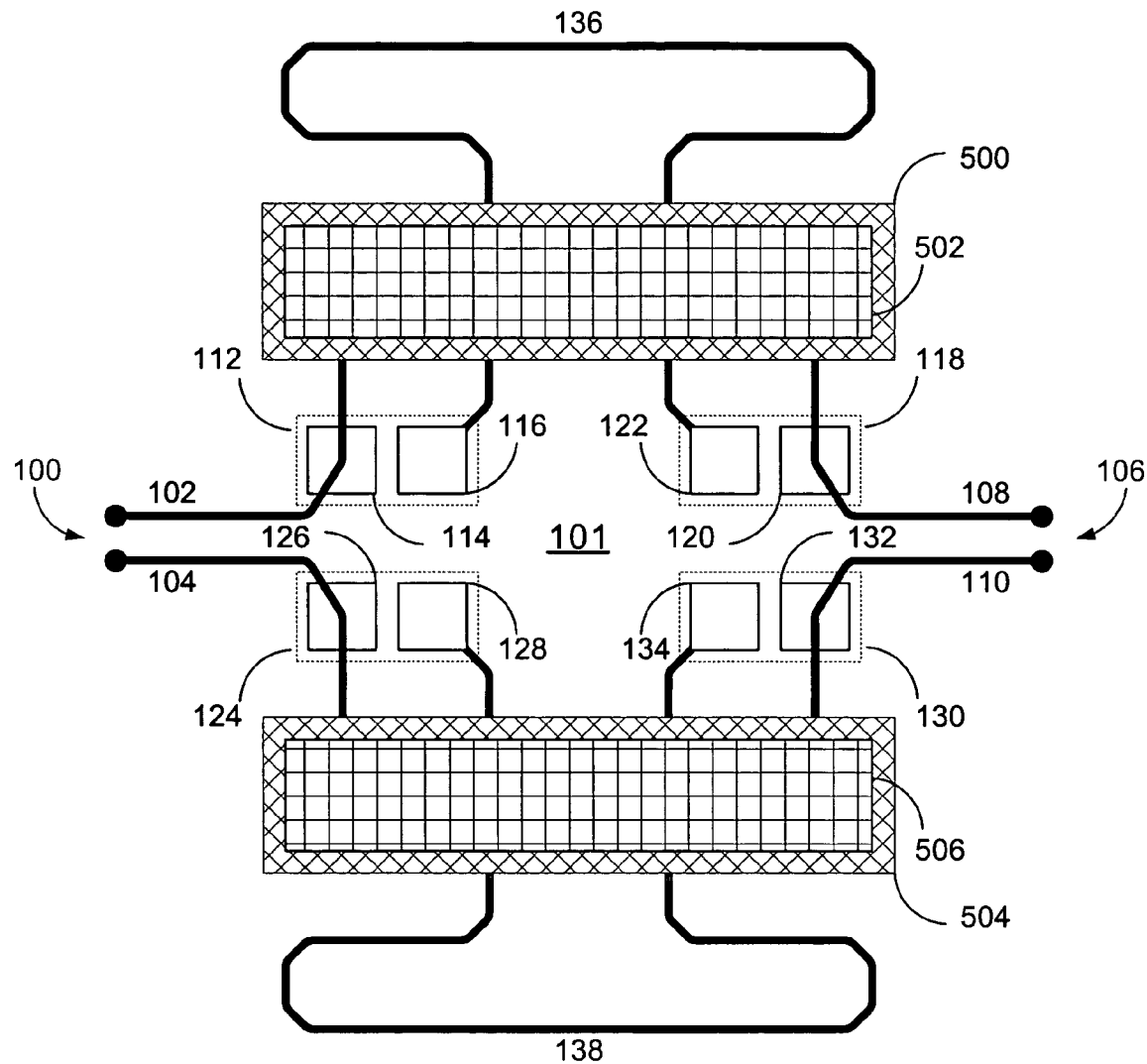
FIG. 5 is a top view of the printed circuit board from FIG. 1 in a test mode with the delay line sockets and delay lines installed.

FIG. 5 is a top view of the printed circuit board from FIG. 1 in a test mode with the delay line sockets and delay lines installed. This example embodiment of the present invention is identical to that shown in FIG. 1, with the exception that upper and lower delay line sockets and delay lines have been connected to the upper and lower delay line landing sites. An upper delay line socket 500 has been connected to the upper delay line landing site 140. An upper delay line 502 has been connected to the upper delay line socket 500. A lower delay line socket 504 has been connected to the lower delay line landing site 146. A lower delay line 506 has been connected to the lower delay line socket 504.

The foregoing description of the present invention has been presented for purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A printed circuit comprising:
    a pair of differential clock traces, each trace including:
        a differential clock input trace;
        a first pad of a delay line socket landing site connected to said differential clock input trace;
        a first pad of a first 0-ohm resistor landing site connected to said differential clock input trace;
        a printed circuit delay line;
        a second pad of a first 0-ohm resistor landing site connected to said printed circuit delay line;
        a first pad of a second 0-ohm resistor landing site connected to said printed circuit delay line;
        a differential clock output trace;
        a second pad of a second 0-ohm resistor landing site connected to said differential clock output trace; and
        a second pad of a delay line socket landing site connected to said differential clock output trace.

2. A printed circuit board as recited in claim 1, wherein each trace of said pair of differential clock traces further includes:
    a first 0-ohm resistor connected to said first pad of a first 0-ohm resistor landing site and said second pad of a first 0-ohm resistor landing site; and
    a second 0-ohm resistor connected to said first pad of a second 0-ohm resistor landing site and said second pad of a second 0-ohm resistor landing site.

3. A printed circuit board as recited in claim 1, wherein each trace of said pair of differential clock traces further includes:
    a delay line socket connected to said first pad of a delay line landing site and said second pad of a delay line landing site.

4. A printed circuit board as recited in claim 1, wherein each trace of said pair of differential clock traces further includes:
    a delay line connected to said delay line socket.

5. A method comprising the steps of:
    a) providing a printed circuit board, including a pair of differential clock traces;
    b) creating a landing site for a delay line socket within a break in each differential clock trace;
    c) creating a pair of landing sites for two series 0-ohm resistors within the break in each differential clock trace;
    d) creating a printed circuit board delay line between each pair of 0-ohm resistor landing sites.

6. A method as recited in claim 5, wherein said landing site for a delay line socket includes a first pad and a second pad.

7. A method as recited in claim 5, wherein said landing site for a 0-ohm resistor includes a first pad and a second pad.

8. A method as recited in claim 5, further including the step of:
    e) connecting 0-ohm resistors to said 0-ohm resistor landing sites.

9. A method as recited in claim 5, further including the step of:
    e) connecting delay line sockets to said delay line socket landing sites.

10. A method as recited in claim 9, further including the step of:
    f) connecting delay lines to said delay line sockets sites.

* * * * *